United States Patent [19]

Schafft

[11] 4,060,741
[45] Nov. 29, 1977

[54] HIGH POWER PIEZOELECTRIC BENDER

[75] Inventor: Hugo Willy Schafft, Des Plaines, Ill.

[73] Assignee: Motorola, Inc., Schaumburg, Ill.

[21] Appl. No.: 644,665

[22] Filed: Dec. 29, 1975

[51] Int. Cl.² .............................................. H01L 41/04
[52] U.S. Cl. ...................................... 310/332; 310/369
[58] Field of Search .................... 310/8.5, 8.6, 8.3, 9.8, 310/9.7, 9.1, 9.4

[56] References Cited

U.S. PATENT DOCUMENTS

| | | | |
|---|---|---|---|
| 3,351,393 | 11/1967 | Emmerich | 310/8.6 X |
| 3,548,116 | 12/1970 | Schafft | 179/110 A |
| 3,592,967 | 7/1971 | Harris | 310/8.6 UX |
| 3,596,116 | 7/1971 | Walton | 310/8.6 |
| 3,629,625 | 12/1971 | Schafft | 310/8.6 |
| 3,675,053 | 7/1972 | Mifune | 310/8.6 X |

Primary Examiner—Mark O. Budd
Attorney, Agent, or Firm—James W. Gillman; James P. Hamley

[57] ABSTRACT

A bimorph bender is comprised of a pair of piezoelectric circular discs having diametrically opposed surface portions. Signal carrying electrodes are formed contiguous with each surface portion. A center vane is sandwiched between the discs maintaining them in a fixed spaced relation. The bender dishes in response to the electrical signals appearing at the electrodes.

Mechanical coupling to the bender is provided by a washer which is affixed in the central portion of the bender. The washer is made of a high specific stiffness material for maintaining a high electro-mechanical coupling factor. The resulting structure provides a highly reliable and efficient power transducer.

11 Claims, 2 Drawing Figures

HIGH POWER PIEZOELECTRIC BENDER

BACKGROUND OF THE INVENTION

The present invention pertains to bimorph benders and, in particular, to an improved means for mechanical coupling to such benders.

Piezoelectric bimorph benders are well known in the art, especially when used in transducer applications. Such benders are normally comprised of a pair of circular piezoelectric elements having diametrically opposed surface portions. Electrodes are formed contiguous with each element surface and extending over a substantial area thereof. The two discs are held in fixed space relationship by a center vane member sandwiched therebetween, and affixed thereto. Upon application of electrical signals to the electrodes, the bender dishes, with maximum displacement occurring at the bender's central location.

The bender's mechanical load has commonly been bonded to the central portion of one disc surface. This construction has proven fault prone since, especially at high power levels, the ceramic may be torn from the center vane. Further, since both ceramic discs contribute to the electromechanical energy conversion, coupling to one disc alone does not provide maximum energy transfer to the load.

Effective coupling to the bender would be accomplished if the driver had a hole in its center, such that the load could be attached thereto as with a nut and bolt. Prior art attempts to fabricate a hole in the center of a bender driver have proven unsuccessful, mainly because the hole equalizes some of the dynamic stresses in the bender thereby reducing the electromechanical coupling factor. The loss in coupling factor cannot be tolerated, since the design objective of piezoelectric motors is to make the driver as efficient as possible with a high power handling capability.

OBJECTS OF THE INVENTION

It is an object of this invention, therefore, to provide an improved bimorph bender structure which is capable of reliably handling high power levels.

It is a further object of the invention to provide an improved bender as described above which maintains a high electromechanical coupling factor.

It is a further object of this invention to provide the improved bimorph bender described above to which a mechanical load may be conveniently affixed.

Briefly, according to the invention, the bimorph bender is comprised of a pair of disc members, each of which is formed of piezoelectric material. The discs have first and second diametrically opposed surface portions, and each disc is provided with a centrally located coupling hole which is defined by a disc coupling hole surface. The electrodes are contiguous with each disc surface, and extend over a substantial portion thereof. A center vane member interconnects the two discs and separates them in a fixed spaced relationship. The center vane is also provided with a centrally located coupling hole, and in combination, the coupling holes are aligned to form a coupling cavity.

A coupling member, formed of an electrically insulating and mechanically rigid material has a predetermined surface dimension adapted for insertion in the coupling cavity. The coupling member is affixed within the cavity such that it is firmly attached to the coupling hole surface of each disc. The coupling member provides a superior means to mechanically couple a load to the bender.

In one construction of the improved bender, the coupling member may be provided with a central hole thus allowing nut and bolt connection to the mechanical load.

DESCRIPTION OF THE PREFERRED EMBODIMENT OF THE INVENTION

Figure 1:
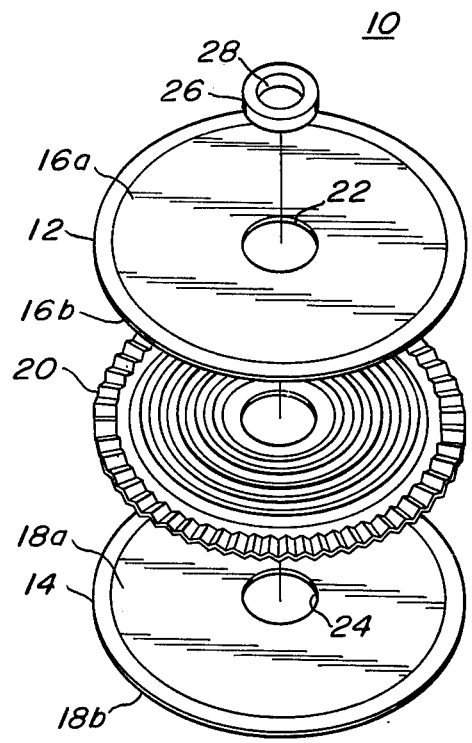
FIG. 1 is an exploded view of the preferred bimorph bender with coupling member.

FIG. 1 is an exploded view of a circular bimorph bender 10. Each bender is comprised of a pair of circular ceramic discs 12, 14. Each disc is made out of an homogenous piezoelectric, ceramic material. This material has a dielectric constant of 3400 and an electromechanical coupling factor $K_p$ of 0.63, even with 5.5 mil thicknesses. Each disc is provided with upper and lower electrodes 16a, b, 18a, b respectively. It should be understood that FIG. 1 illustrates only the upper electrode 16a of disc 12 and the upper electrode 18a of disc 14. Preferably, the electrodes are of nickel thus providing the highest capacity and highest coupling factor.

A corrugated center vane member 20 is sandwiched between the two discs and, via a thin layer of nonconductive epoxy on the tips of the corrugations, bonds the discs to the center vane maintaining a fixed space relationship therebetween. Each disc 12, 14 is provided with a centrally located mounting hole which is defined by disc coupling hole surfaces 22, 24 respectively. Also, the center vane 20 is provided with a central coupling hole whereby, in construction of the bimorph, the holes are aligned to form a coupling cavity.

A cylindrical washer 26 is the coupling member for the bimorph assembly. Cylindrical coupling member 26 has a predetermined diameter which is slightly less than the diameter of the coupling cavity, whereby the coupling member 26 may be inserted therein. The vertical dimension of the coupling member 26 is such that when inserted in the coupling cavity the outer surface of the coupling member 26 is contiguous with the coupling hole surfaces 22, 24 of the discs 12, 14. The coupling member 26 is formed of a high specific stiffness material, such as alumina ceramic. In this preferred embodiment, the coupling member 26 is provided with a central mounting hole 28 which extends through the axial center of the cylindrical coupling member 26.

The coupling member 26 is inserted within the coupling cavity and a high stiffness, electrically insulating epoxy cements the coupling member 26 to the disc mounting hole surfaces 22, 24 respectively.

In operation, the electrodes are wired in phase, that is, the upper electrode 16a of disc 12 is electrically connected to the upper electrode 18a of disc 14, whereas the lower electrodes 16b, 18b are interconnected. AC signals are applied to the electrodes, whereby, due to the piezoelectric effect, one disc expands radially while the other radially contracts. The result is a dishing of the bender with the direction of dishing dependent on the polarity of the applied signal. The bender displacement is directly proportional to the magnitude of the applied signal, and, their maximum displacement occurs at the central portion of the bender. In prior art benders, the mechanical load was bonded directly to the central portion of an exposed disc surface. The bond of the load to the bender was therefore as good as the bond of the electrode to the disc, which meant that for heavy load conditions the load might strip the electrode off the disc, or, more commonly, the load would rip the ceramic disc off of the center vane.

The bimorph bender according to the instant invention provides an improved means for coupling to the load. In particular, the coupling member 26, which is located at the point of maximum displacement in the bender, may be used for firm attachment to the load, as for example, by nut and bolt if need be. Since the coupling member 26 is affixed to both discs 10, 14 maximum power transfer to the load is accomplished, with a mimimum shear force between discs, electrodes, and the center vane.

Also, since the coupling member 26 is fabricated with a high specific stiffness material, the mechanical stress forces on the bender are maintained whereby a high electromechanical coupling factor is achievable. In one embodiment of the invention, a bender was fabricated having a total thickness of 25 mils and a diameter of 1.25 inches. The initial bending coupling factor $K_b$ of the bender was measured at 0.508, where:

$K_b$ = (induced mechanical energy/total input electrical energy)$^{-\frac{1}{2}}$.

After drilling a central grounding hole of diameter 0.256 inches, the $k_b$ was measured as 0.426. Thereafter, after insertion and cementing in the alumina washer the coupling factor $K_b$ returned to 0.508. Therefore, the improved bimorph bender maintains a high coupling factor while providing an improved means of coupling to a mechanical load.

Figure 2:
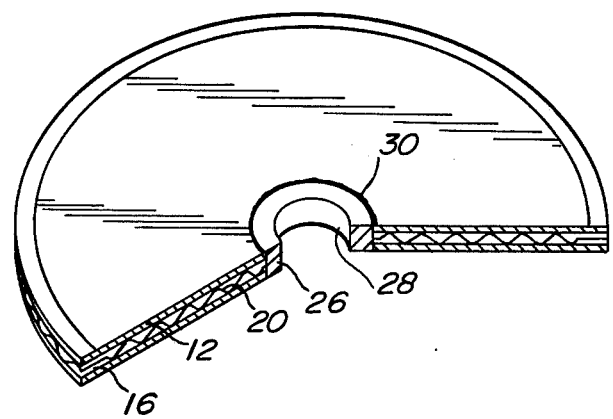
FIG. 2 is a cutaway view of an assembled bimorph bender according to the invention.

FIG. 2 illustrates a cutaway perspective view of the preferred circular bimorph bender. Shown are the ceramic discs 12, 16 in fixed spaced relation via a center vane 20. Cemented within the central coupling cavity of the bimorph assembly is shown the coupling member 26. The vertical dimension of the coupling member 26 is such that it may be cemented to both the upper and lower discs 12, 16 respectively, via an insulating, high stiffness epoxy 30. It is important that the cementing material used be of a stiff and electrically insulating material to maintain the mechanical stresses across the bender, while electrically insulating the various electrodes. A mounting hole 28 is provided through the axial center of the cylindrical coupling member 26, whereby coupling to a mechanical load is accomplished with greater facility.

In summary, an improved bimorph bender is disclosed which can handle high power levels with reliability and efficiency, and which provides a convenient means for attaching the bender to a mechanical load.

While a preferred embodiment of the invention is shown, it should be understood that many modifications and variations thereto are possible, all of which fall within the true spirit and scope of the invention.

What is claimed is:

1. A bimorph bender for driving a mechanical member comprising:
    a pair of disc members, each disc member formed of a piezoelectric material and having first and second diametrically opposed surface portions, each disc further provided with a centrally located coupling hole defined by a disc coupling hole surface;
    electrode members contiguous with a substantial portion of each disc member first and second surface portions;
    a center vane member, provided with a centrally located coupling hole, for separating the discs in fixed spaced relationship and aligning the coupling holes to form a coupling cavity;
    a coupling member comprised of an electrically insulating and mechanically stiff material, having a stiffness approximately equal to or greater than said piezoelectric material, and having a predetermined surface dimension for insertion in the coupling cavity, the coupler member further provided with a means adapted to rigidly affix the coupling member to the mechanical member; and
    a means for affixing the coupling member within the coupling cavity such that the coupling member is stiffly attached to the coupling hole surface of each disc,
    whereby the coupling member material and dimension maintains a high mechanical stress force across the bender surface to achieve a high electromechanical coupling factor thereof while providing a means adapted to mechanically affix and transmit movement of the bender to the mechanical member.

2. The bimorph bender of claim 1 wherein each disc is circular in shape.

3. The bimorph bender of claim 1 wherein each disc coupling hole is circular in shape.

4. The bimorph bender of claim 3 wherein the coupling member is cylindrical in shape having a diameter slightly smaller than that of the coupling hole cavity and having a vertical dimension to contact a substantial portion of each disc coupling hole surface.

5. The bimorph bender of claim 4 wherein the coupling member is further provided with a mounting hole surface defining a central mounting hole which extends through the axial center of the coupling member.

6. The bimorph bender of claim 1 wherein the coupling member is fabricated of alumina ceramic.

7. The bimorph bender of claim 5 wherein the means for affixing the coupling member within the coupling cavity comprises an alumina filled epoxy cement for cementing the coupling member outer surface to each disc coupling hole surface.

8. In a bender having a pair of circular discs made of a piezoelectric material, each disc having diametrically opposed faces with electrodes thereon, the discs being separated by a center vane member, in fixed spaced relationship to form a predetermined bender thickness, the improvement for driving a mechanical member comprising:
    a predeterminedly dimensioned aperture provided through the bender, the aperture being located central to the bender and on axis with a line perpendicular to the face of each disc,
    a cylindrical coupling member made of an electrically insulating meberial having stiffness approximately as great as, or greater than said piezoelectric material, the coupling member having a predetermined diameter for insertion within the aperture and having a vertical dimension substantially equal to the thickness of the bender, the coupling member including means adapted to rigidly affix the coupling member to the mechanical member;
    a means for rigidly affixing the coupling member vertical outer surface to the discs, whereby the coupling member material and dimension maintains a high mechanical stress force across the bender surface to achieve a high electromechanical coupling factor thereof while providing a means adapted to mechanically affix, and transmit movement of, the bender to the mechanical member.

9. The improvement of claim 8 wherein the coupling member is further comprised of a mounting hole surface for defining a mounting hole which extends through the axial center of the coupling member.

10. The improvement of claim 8 wherein the coupling member is fabricated of an alumina ceramic.

11. The improvement of claim 8 wherein the means for rigidly affixing the coupling member vertical surface to the discs is comprised of an alumina filled epoxy cement.

* * * * *